(12) United States Patent
Huang

(10) Patent No.: US 11,394,011 B2
(45) Date of Patent: *Jul. 19, 2022

(54) ORGANIC LIGHT-EMITTING DIODE DEVICE INCLUDING FUNCTIONAL LAYER MADE OF ACIDIC METAL SOL, MANUFACTURING METHOD THEREOF, AND DISPLAY DEVICE

(71) Applicant: TCL CHINA STAR OPTOELECTRONICS TECHNOLOGY CO., LTD., Guangdong (CN)

(72) Inventor: Hui Huang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 128 days.

This patent is subject to a terminal disclaimer.

(21) Appl. No.: 16/970,637

(22) PCT Filed: Jul. 8, 2020

(86) PCT No.: PCT/CN2020/100883
§ 371 (c)(1),
(2) Date: Aug. 18, 2020

(87) PCT Pub. No.: WO2021/208272
PCT Pub. Date: Oct. 21, 2021

(65) Prior Publication Data
US 2021/0328191 A1 Oct. 21, 2021

(30) Foreign Application Priority Data
Apr. 17, 2020 (CN) .......................... 202010306664.6

(51) Int. Cl.
*H01L 51/52* (2006.01)
*H01L 51/56* (2006.01)
*H01L 27/32* (2006.01)

(52) U.S. Cl.
CPC ...... *H01L 51/5262* (2013.01); *H01L 27/3244* (2013.01); *H01L 51/56* (2013.01); *H01L 2251/5369* (2013.01)

(58) Field of Classification Search
None
See application file for complete search history.

(56) References Cited

U.S. PATENT DOCUMENTS

2006/0172448 A1  8/2006  Carter et al.
2018/0062104 A1  3/2018  Kwon et al.
(Continued)

FOREIGN PATENT DOCUMENTS

CN    105977393 A    9/2016
CN    106450016 A    2/2017
(Continued)

*Primary Examiner* — J. E. Schoenholtz
(74) *Attorney, Agent, or Firm* — The Roy Gross Law Firm, LLC; Roy Gross

(57) ABSTRACT

The present disclosure provides an organic light-emitting diode device, a method of manufacturing the same, and a display device. The organic light-emitting diode device includes a functional layer and a cathode layer, wherein material of the functional layer includes an acidic metal sol, and hydrogen ions in the acidic metal sol can be attached to a surface of the conductive metal nanoparticles and anchored with cations on a surface of the cathode layer to enhance adhesion between layers. The direction of free electrons in the cathode layer is changed to avoid coupling reaction with photons, thereby improving the light-emitting efficiency.

20 Claims, 4 Drawing Sheets

(56) References Cited

U.S. PATENT DOCUMENTS

2019/0173051 A1* 6/2019 Bu ........................ H01L 51/56
2022/0006055 A1* 1/2022 Huang ................ H01L 51/5268

FOREIGN PATENT DOCUMENTS

CN        106450022 A     2/2017
CN        107799657 A     3/2018

* cited by examiner providing a substrate on which an anode layer, a hole transport layer, a light-emitting layer, and an electron transport layer are sequentially formed; — S1 forming a functional layer on a side of the electron transport layer away from the light-emitting layer, wherein material of the functional layer comprises an acidic metal sol comprising conductive metal nanoparticles; — S2 forming a cathode layer on a side of the functional layer away from the electron transport layer. — S3

FIG. 5

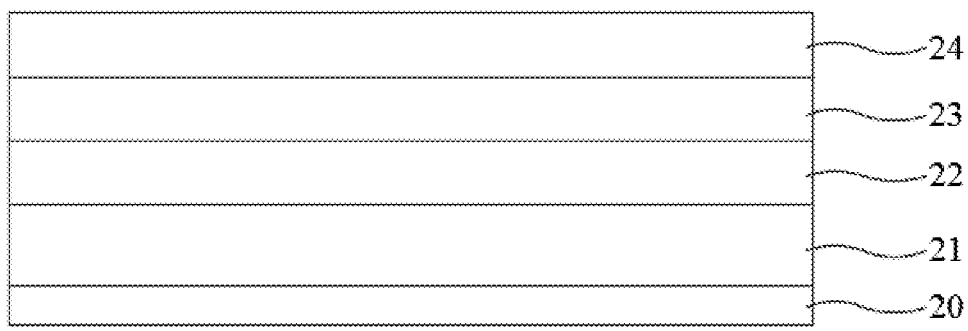

FIG. 6A

ORGANIC LIGHT-EMITTING DIODE DEVICE INCLUDING FUNCTIONAL LAYER MADE OF ACIDIC METAL SOL, MANUFACTURING METHOD THEREOF, AND DISPLAY DEVICE

BACKGROUND OF INVENTION

Field of Invention

The present disclosure relates to a field of display technology, in particular to an organic light-emitting diode device, a manufacturing method thereof, and a display device.

Description of Prior Art

Existing organic light-emitting diode (OLED) devices have a light loss there inside, resulting in most of the light cannot be effectively emitted outside the organic light-emitting diode device, and the main part of the light loss is caused by a coupling reaction between photons emitted from the light-emitting layer and free electrons of the cathode and generation of surface plasmon waves, so that this part of the light cannot reach the outside of the organic light-emitting diode device, resulting in a decrease in the overall luminous efficiency of the organic light-emitting diode device.

Most of the current improvement methods are to increase a distance between the light-emitting layer and the cathode to reduce the influence therebetween, thereby improving the light-emitting efficiency. However, merely increasing the distance between the light-emitting layer and the cathode will cause an increase in defects of films inside the organic light-emitting diode device, and a specific cavity length of the organic light-emitting diode device will change, which will cause the film separation and peeling inside the organic light-emitting diode device, and the light inside the organic light-emitting diode device is weakened, resulting in a decrease in the light-emitting efficiency of the organic light-emitting diode device.

In summary, the existing organic light-emitting diode device has the problem of a decrease in the luminous efficiency of the organic light-emitting diode device caused by a coupling reaction between photons emitted from the light-emitting layer and free electrons of the cathode and generation of surface plasmon waves. Therefore, there is a need to provide an organic light-emitting diode, a manufacturing method thereof, and a display device to improve this defect.

SUMMARY OF INVENTION

Embodiments of the present disclosure provide an organic light-emitting diode device, a manufacturing method thereof, and a display device, which are used to solve the problem of the existing organic light-emitting diode device that the luminous efficiency of the organic light-emitting diode device is decreased caused by a coupling reaction between photons emitted from the light-emitting layer and free electrons of the cathode and generation of surface plasmon waves.

An embodiment of the present disclosure provides an organic light-emitting diode device, including an anode layer, a hole transport layer, a light-emitting layer, an electron transport layer, a functional layer, and a cathode layer that are sequentially stacked;

wherein material of the functional layer includes an acidic metal sol, and the acidic metal sol contains conductive metal nanoparticles.

According to an embodiment of the present disclosure, the conductive metal nanoparticles include one or more of conductive Au nanoparticles, conductive Ag nanoparticles, and conductive Al nanoparticles.

According to an embodiment of the present disclosure, the organic light-emitting diode device further includes a buffer layer including an organic material, and the buffer layer is disposed between the functional layer and the electron transport layer.

According to an embodiment of the present disclosure, material of the functional layer further includes an organic material.

According to an embodiment of the present disclosure, a ratio of the acidic metal sol to the organic material of the functional layer is between 1:5 and 5:1.

According to an embodiment of the present disclosure, the organic material of the functional layer includes epoxy resin.

According to an embodiment of the present disclosure, the organic light-emitting diode device further includes a hole injection layer and an electron injection layer, the hole injection layer is disposed between the hole transport layer and the anode layer, and the electron injection layer is disposed between the functional layer and the electron transport layer.

An embodiment of the present disclosure also provides a display device, including a device body and a display panel disposed on the device body, wherein the display panel includes a thin film transistor array substrate and a plurality of organic light-emitting diode devices disposed on the thin film transistor array substrate, each of the organic light-emitting diode devices includes an anode layer, a hole transport layer, a light-emitting layer, an electron transport layer, a functional layer, and a cathode layer that are sequentially stacked; and wherein material of the functional layer includes an acidic metal sol, and the acidic metal sol contains conductive metal nanoparticles.

According to an embodiment of the present disclosure, the conductive metal nanoparticles include one or more of conductive Au nanoparticles, conductive Ag nanoparticles, and conductive Al nanoparticles.

According to an embodiment of the present disclosure, the organic light-emitting diode device further includes a buffer layer including an organic material, and the buffer layer is disposed between the functional layer and the electron transport layer.

According to an embodiment of the present disclosure, material of the functional layer further includes an organic material.

According to an embodiment of the present disclosure, a ratio of the acidic metal sol to the organic material of the functional layer is between 1:5 and 5:1.

According to an embodiment of the present disclosure, the organic material of the functional layer includes epoxy resin.

According to an embodiment of the present disclosure, the organic light-emitting diode device further includes a hole injection layer and an electron injection layer, the hole injection layer is disposed between the hole transport layer and the anode layer, and the electron injection layer is disposed between the functional layer and the electron transport layer.

Another embodiment of the present disclosure also provide a method of manufacturing an organic light-emitting diode device, including:

providing a substrate on which an anode layer, a hole transport layer, a light-emitting layer, and an electron transport layer are sequentially formed;

forming a functional layer on a side of the electron transport layer away from the light-emitting layer, wherein material of the functional layer includes an acidic metal sol including conductive metal nanoparticles; and forming a cathode layer on a side of the functional layer away from the electron transport layer.

According to an embodiment of the present disclosure, a step of preparing the material of the functional layer includes:

immersing the conductive metal nanoparticles in an acidic solvent for 12-24 hours;

filtering the immersed conductive metal nanoparticles, and followed by a drying treatment at a temperature of 80 to 120° C.;

formulating the dried conductive metal nanoparticles into the acidic metal sol; and mixing the acidic metal sol and an organic material according to a certain ratio to form the material of the functional layer.

According to an embodiment of the present disclosure, the conductive metal nanoparticles include one or more of conductive Au nanoparticles, conductive Ag nanoparticles, and conductive Al nanoparticles.

According to an embodiment of the present disclosure, the acidic solvent includes dilute nitric acid, acetic acid, dilute phosphoric acid, or dilute hydrochloric acid.

According to an embodiment of the present disclosure, a concentration of the acidic solvent is between 5% and 25%.

According to an embodiment of the present disclosure, a ratio of the acidic metal sol to the organic material is between 1:5 and 5:1.

Beneficial effect of embodiments of the present disclosure: In an embodiment of the present disclosure, by additionally introducing a functional layer between the cathode layer and the light-emitting layer, wherein the material of the functional layer includes an acidic metal sol having hydrogen ions which can adhere to a surface of the conductive metal nanoparticles in the acidic metal sol, which can be anchored with cations on a surface of a side of the cathode layer close to the functional layer, adhesion between the functional layer and the cathode layer is thereby enhanced, and separation and peeling of the layers is prevented. In addition, direction of free electrons in the cathode layer will also be changed to avoid the coupling reaction with photons to generate surface plasmon waves, thereby improving the light-emitting efficiency of the organic light-emitting diode.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present disclosure. Other drawings may also be obtained by those skilled in the art according to these figures without paying creative work.

FIG. 5 is a schematic flowchart of a method of manufacturing an organic light-emitting diode device provided by an embodiment of the present disclosure.

FIGS. 6A-6C are schematic structural diagrams of an organic light-emitting diode device corresponding to a manufacturing method provided by an embodiment of the present disclosure.

DETAILED DESCRIPTION OF PREFERRED EMBODIMENTS

The following description of the various embodiments is provided to illustrate the specific embodiments of the present disclosure. The spatially relative directional terms mentioned in the present disclosure, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

Figure 1:
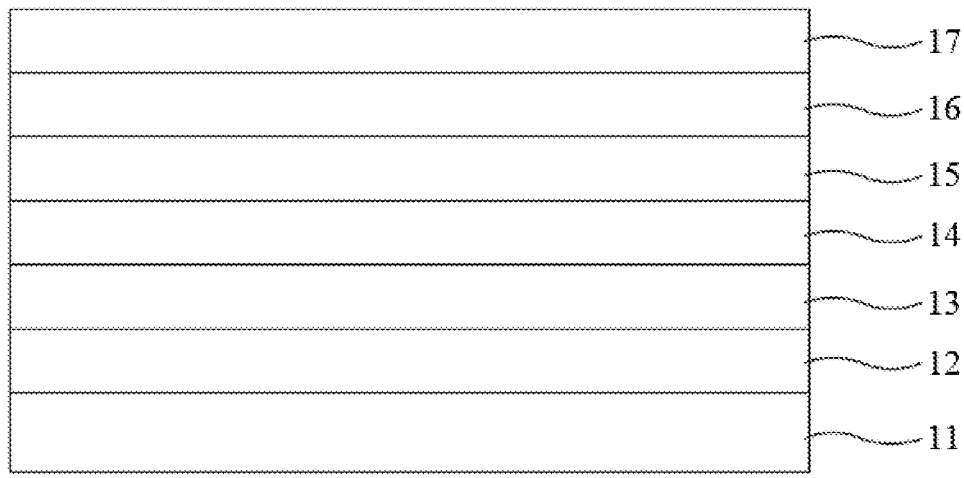
FIG. 1 is a schematic structural diagram of an organic light-emitting diode device provided by an embodiment of the present disclosure.

The present disclosure is further described below in conjunction with the drawings and specific embodiments:

An embodiment of the present disclosure provides an organic light-emitting diode device 1, which will be described in detail below with reference to FIG. As shown in FIG. 1, FIG. 1 is a schematic structural diagram of an organic light-emitting diode device 1 according to an embodiment of the present disclosure. The organic light-emitting diode device 1 includes an anode layer 11, a hole transport layer 12, and a light-emitting layer 13 that are sequentially stacked. The electron transport layer 14, the buffer layer 15, the functional layer 16, and the cathode layer 17.

In an embodiment of the present disclosure, the material of the functional layer 16 includes an acidic metal sol having hydrogen ions which can adhere to a surface of the conductive metal nanoparticles in the acidic metal sol, and the conductive metal nanoparticles adhered with the hydrogen ions can be anchored with cations on a surface of a side of the cathode layer 17 close to the functional layer 16, such that adhesion between the functional layer 16 and the cathode layer 17 is thereby enhanced, to strengthen connection between the cathode layer 17 and the functional layer 16, and thus separation and peeling of the layers is prevented. In addition, direction of free electrons in the cathode layer 17 will also be changed due to presence of the hydrogen ions, such that a coupling reaction with photons to generate surface plasmon waves can be avoided, thereby improving the light-emitting efficiency of the organic light-emitting diode 1.

Specifically, in an embodiment of the present disclosure, the conductive metal nanoparticles are Au conductive nanoparticles. After drying and curing, the acidic metal sol containing Au conductive nanoparticles can make the surface of the functional layer 16 form tiny uneven nanostructures which have a scattering effect on light, and can change the direction of the photons emitted by the light-emitting layer 13, so that combination between the photons and the free electrons on a surface of a side of the cathode layer 17 close to the functional layer 16 is decreased, thereby further avoiding the coupling reaction between the free electrons in the cathode layer 17 and the photons emitted from the light-emitting layer 13 and generation of surface plasmon waves, thus improving the light-emitting efficiency of the organic light-emitting diode 1.

Of course, in some embodiments, the conductive metal nanoparticles may also be Ag conductive nanoparticles or Al conductive nanoparticles, and alternatively, the conductive metal nanoparticles may also be two or more of conductive Au nanoparticles, conductive Ag nanoparticles, and conductive Al nanoparticles, which can also obtain the same technical effects as the embodiment of the present disclosure, and can be selected according to actual needs, which is not particularly limited herein.

Specifically, in an embodiment of the present disclosure, the material of the buffer layer 15 includes an organic material. The buffer layer 15 made of an organic material is provided between the electron transport layer 14 and the functional layer 16 to protect the layers such as the electron transport layer 14 and the light-emitting layer 13, and prevent the layers such as the electron transport layer 14 and the light-emitting layer 13 from being destroyed in the process of forming the functional layer 16 and the cathode layer 17.

Preferably, the organic material including an epoxy resin to take advantage of the good adhesion properties, mechanical properties and stability of the epoxy resin material, and while protecting the layers such as the electron transport layer 14 and the light-emitting layer 13, the functional layer 16 and the electron transport layer 14 can be prevented from separation or peeling off. Of course, In some embodiments, the organic material may also be other materials with the same or similar properties as the epoxy resin, which is not particularly limited herein.

Specifically, in an embodiment of the present disclosure, a thickness of the buffer layer 15 is 30 nm, a thickness of the functional layer 16 is 20 nm, and a thickness of the cathode layer 17 may be appropriately reduced related to its original thickness, so that the total thickness of the buffer layer 15, the functional layer 16, and the cathode layer 17 is the same as an original thickness of the cathode layer, so as to ensure that a cavity length of the organic light-emitting diode device 1 remains unchanged, so that light emitted from the light-emitting layer 13 can be superimposed and enhanced in light intensity in the organic light-emitting diode device 1 by characteristics of the light.

Of course, the thicknesses of the buffer layer 15, the functional layer 16, and the cathode layer 17 are not particularly limited to the thicknesses provided in the above embodiment. In some embodiments, the thickness of the buffer layer 15 is between 10-50 nm, the thickness of the layer of the functional layer 16 is between 5 and 30 nm, and the thickness of the cathode layer 17 is between 20 and 100 nm, which can satisfy the effect of increasing the light transmission efficiency of the organic light-emitting diode device 1 under the condition of ensuring the constant cavity length.

Optionally, in an embodiment of the present disclosure, the material of the cathode layer 17 may be metal or metal oxide. Preferably, the material of the cathode layer 17 is a metal oxide, such as ZnO or IZO. Of course, in some embodiments, the material of the cathode layer 17 may also be a metal material or a stacked structure formed of metal materials, which is not particularly limited herein.

Beneficial effect of embodiments of the present disclosure: In an embodiment of the present disclosure, by additionally introducing a functional layer between the cathode layer and the light-emitting layer, wherein the material of the functional layer includes an acidic metal sol having hydrogen ions which can adhere to a surface of the conductive metal nanoparticles in the acidic metal sol, which can be anchored with cations on a surface of a side of the cathode layer close to the functional layer, adhesion between the functional layer and the cathode layer is thereby enhanced, and separation and peeling of the layers is prevented. In addition, direction of free electrons in the cathode layer will also be changed to avoid the coupling reaction with photons to generate surface plasmon waves, thereby improving the light-emitting efficiency of the organic light-emitting diode. Furthermore, by disposing a buffer layer made of organic material between the electron transport layer and the functional layer to protect the layers such as the electron transport layer and the light-emitting layer, and to prevent the layers such as the electron transport layer and the light-emitting layer from being destroyed during the process of forming the functional layer and the cathode layer.

Figure 2:
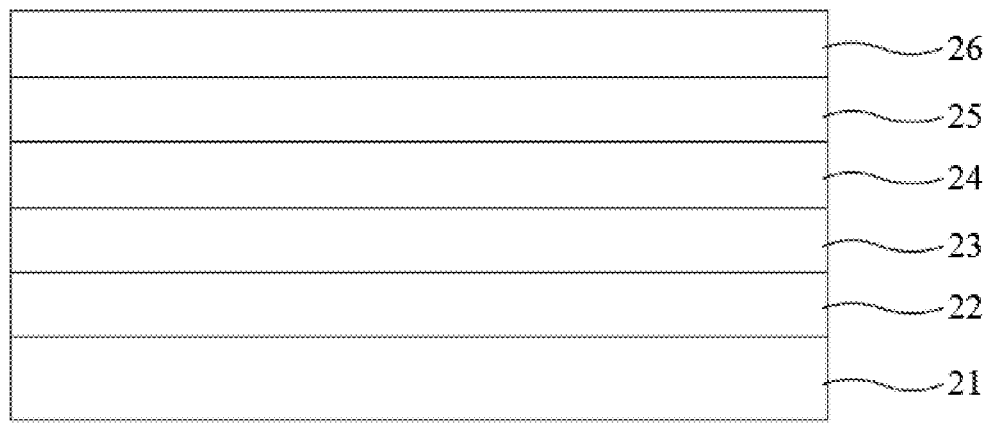
FIG. 2 is a schematic structural diagram of a light-emitting diode provided by another embodiment of the present disclosure.

Another embodiment of the present disclosure also provides an organic light-emitting diode device 2, which will be described in detail below with reference to FIGS. 2 and 3. As shown in FIG. 2, FIG. 2 is a schematic structural diagram of an organic light-emitting diode device 2 according to an embodiment of the present disclosure. The organic light-emitting diode device 2 includes an anode layer 21, a hole transport layer 22, a light-emitting layer 23, an electron transport layer 24, functional layer 25, and cathode layer 26 that are sequentially stacked.

In an embodiment of the present disclosure, the material of the functional layer 25 includes an acidic metal sol having hydrogen ions which can adhere to a surface of the conductive metal nanoparticles in the acidic metal sol, and the conductive metal nanoparticles adhered with the hydrogen ions can be anchored with cations on a surface of a side of the cathode layer 26 close to the functional layer 25, such that adhesion between the functional layer 25 and the cathode layer 26 is thereby enhanced, to strengthen connection between the cathode layer 26 and the functional layer 25, and thus separation and peeling of the layers is prevented. In addition, the direction of free electrons in the cathode layer 26 will also change due to the presence of hydrogen ions, so as to avoid the coupling reaction between the free electrons in the cathode layer 26 and the photons emitted from the light-emitting layer 23 and generation of surface plasmon waves, thereby improving the light-emitting efficiency of the organic light-emitting diode device 2.

In an embodiment of the present disclosure, the material of the functional layer 25 further includes an organic material, and the organic material and the acidic metal sol are mixed according to a certain ratio to form the material of the functional layer 25. Adding an organic material into the functional layer 25 can facilitate the curing of the acidic metal sol to form a thin film of the functional layer 25, and can also ensure the flatness of a surface of a side of the formed functional layer 25 close to the cathode layer 26, preventing the conductive metal nanoparticles in the acidic metal sol after curing from forming an uneven nanostructure which reduces the bonding strength between the functional layer 25 and the cathode layer 26, and preventing the cathode layer 26 and the functional layer 25 from separation and peeling at an interface therebetween, and meanwhile, the electron transport layer 24 and the light-emitting layer 23 under the functional layer 25 may be prevented from being damaged during the process of forming the cathode layer 26.

Specifically, in an embodiment of the present disclosure, the conductive metal nanoparticles are Au conductive nanoparticles. Of course, in some embodiments, the conductive metal nanoparticles may also be Ag conductive nanoparticles or Al conductive nanoparticles, and alternatively, the conductive metal nanoparticles may also be two or more of conductive Au nanoparticles, conductive Ag nanoparticles, and conductive Al nanoparticles, which can also obtain the same technical effects as the embodiment of the present disclosure, and can be selected according to actual needs, which is not particularly limited herein.

Specifically, in an embodiment of the present disclosure, the organic material of the functional layer 25 is an epoxy resin to take advantage of the good adhesion properties, mechanical properties and stability of the epoxy resin material, and while protecting the layers such as the electron transport layer 24 and the light-emitting layer 23, the functional layer 25 and the electron transport layer 24 can be prevented from separation or peeling off. Of course. In some embodiments, the organic material may also be other materials with the same or similar properties as the epoxy resin, which is not particularly limited herein.

Specifically, in an embodiment of the present disclosure, a ratio of the acidic metal sol to the organic material in the material of the functional layer 25 is 3:3, so as to ensure the flatness of a surface of a side of the functional layer 25 close to the cathode layer 26 as well as the adhesion to the adjacent layer, and meanwhile, the conductive metal nanoparticles can be evenly dispersed in the functional layer 25 to ensure the functionality of the acidic metal sol. Of course, the ratio of the acidic metal sol to the organic material is not particularly limited to the 3:3 provided in the embodiment of the present disclosure. In other embodiments, as long as the ratio of the acidic metal sol to the organic material ranges from 1:5 to 5:1, the same or similar technical effects as the above embodiments can be obtained, and the specific ratio can be selected according to actual needs, which is not particularly limited herein.

Specifically, in an embodiment of the present disclosure, a thickness of the functional layer 25 is 50 nm, and a thickness of the cathode layer 26 can be appropriately reduced related to its original thickness, so that a total thickness of the function layer 25 and the cathode layer 26 is the same as that of the original thickness of the cathode layer, and under a premise that influence of electron injection is avoided while maintaining the conductivity of the cathode layer 26 itself, the cavity length of the organic light-emitting diode device 2 can be maintained unchanged, so that light emitted from the light-emitting layer 23 can be superimposed and enhanced in light intensity in the organic light-emitting diode device 2 by characteristics of the light.

Of course, the thicknesses of the functional layer 25 and the cathode layer 26 are not particularly limited to those provided in the above embodiments. In other embodiments, the thickness of the functional layer 25 is between 10-100 nm, and the thickness of the cathode layer 26 is between 20 and 100 nm, which can satisfy the effect of increasing the light transmission efficiency of the organic light-emitting diode device 2 under the condition of ensuring the constant cavity length.

Figure 3:
FIG. 3 is a schematic structural diagram of a light-emitting diode according to another embodiment of the present disclosure.

As shown in FIG. 3, FIG. 3 is a schematic structural diagram of an organic light-emitting diode device provided by another embodiment of the present disclosure. In some embodiments, the organic light-emitting diode device 2 may further include a hole injection layer 27 and an electron injection layer 28 as shown in FIG. 3, the hole injection layer 27 is disposed between the hole transport layer 22 and the anode layer 21, and the electron injection layer 28 is disposed between the functional layer 25 and the electron transport layer 24. Of course, in other embodiments, the light-emitting diode device 2 may further include other auxiliary layers in addition to the hole injection layer 27 and the electron injection layer 28, which can be set according to actual needs, and not particularly limited herein.

Beneficial effect of embodiments of the present disclosure: In an embodiment of the present disclosure, by additionally introducing a functional layer between the cathode layer and the light-emitting layer, wherein the material of the functional layer includes an acidic metal sol having hydrogen ions which can adhere to a surface of the conductive metal nanoparticles in the acidic metal sol, which can be anchored with cations on a surface of a side of the cathode layer close to the functional layer, adhesion between the functional layer and the cathode layer is thereby enhanced, and separation and peeling of the layers is prevented. In addition, direction of free electrons in the cathode layer will also be changed to avoid the coupling reaction with photons to generate surface plasmon waves, thereby improving the light-emitting efficiency of the organic light-emitting diode. Furthermore, the organic material can ensure the flatness of a surface of a side the functional layer close to the cathode layer, to prevent the conductive metal nanoparticles in the acidic metal sol after curing from forming an uneven nanostructure which reduces the bonding strength between the functional layer and the cathode layer, and to prevent the cathode layer and the functional layer from separation and peeling at an interface therebetween, and meanwhile, the electron transport layer and the light-emitting layer under the functional layer may be prevented from being damaged during the process of forming the cathode layer.

Figure 4:
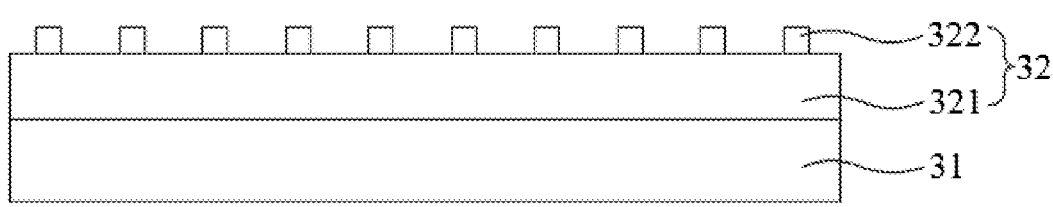
FIG. 4 is a schematic structural diagram of a display device provided by an embodiment of the present disclosure.

An embodiment of the present disclosure also provides a display device, which will be described in detail below with reference to FIG. 4. FIG. 4 is a schematic structural diagram of a display device 3 according to an embodiment of the present disclosure. The display device 3 includes a device body 31 and a display panel 32 disposed on the device body 31. The display panel 32 includes a thin film transistor array substrate 321 and a plurality of organic light-emitting diode devices 322 provided on the thin film transistor array substrate 321, the organic light-emitting diode devices 322 are the organic light-emitting diode devices provided in the above embodiments. The display device 3 provided by this embodiment of the present disclosure can also achieve the same technical effect as the organic light-emitting diode device provided by the above embodiments, and will not be repeated herein for brevity.

An embodiment of the present disclosure also provides a method of manufacturing an organic light-emitting diode device, which will be described in detail below with reference to FIGS. 5 to 6, wherein FIG. 5 is a schematic flowchart of a method of manufacturing an organic light-emitting diode device provided by an embodiment of the present disclosure. FIGS. 6A to 6C are schematic structural diagrams of an organic light-emitting diode device corresponding to a manufacturing method provided by an embodiment of the present disclosure.

Figure 6B:
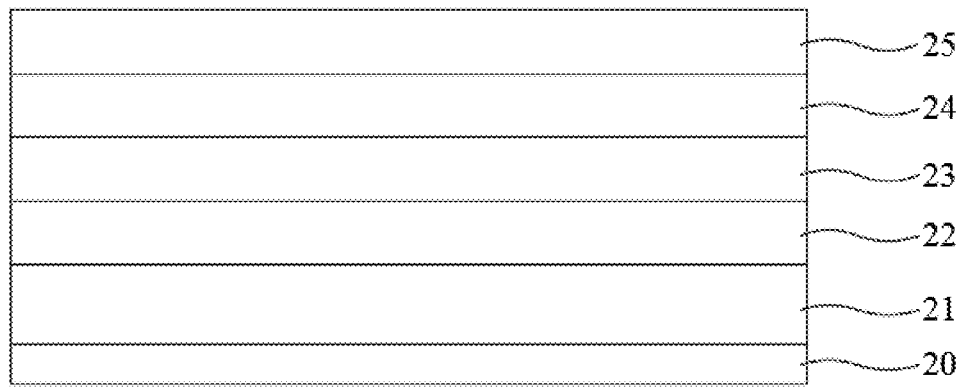
Figure 6C:
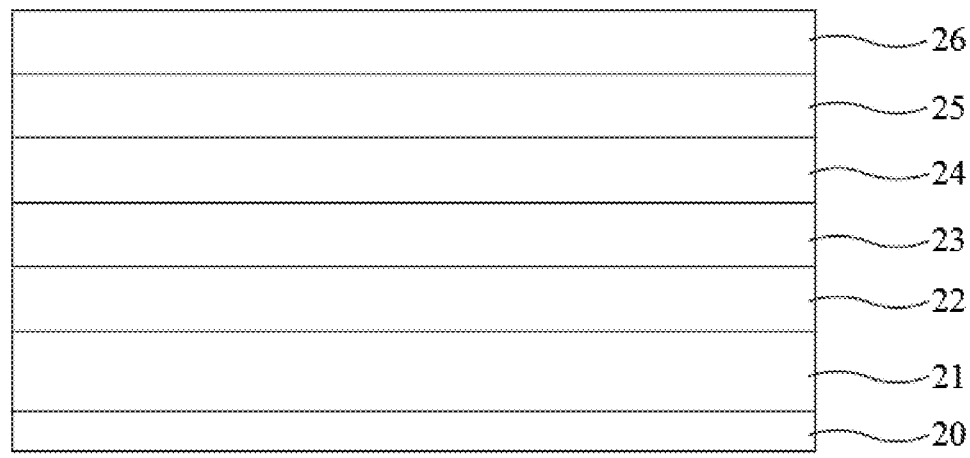

The method of manufacturing the organic light-emitting diode device provided by an embodiment of the present disclosure includes:

Step S1: as shown in FIG. 6A, providing a substrate 20 on which an anode layer 21, a hole transport layer 22, a light-emitting layer 23, and an electron transport layer 24 are sequentially formed a substrate 20 is provided;

Step S2: as shown in FIG. 6B, forming a functional layer 25 on a side of the electron transport layer 24 away from the light-emitting layer 23, wherein material of the functional layer 25 includes an acidic metal sol including conductive metal nanoparticles; and Step S3: as shown in FIG. 6C, forming a cathode layer 26 on a side of the functional layer 25 away from the electron transport layer.

In an embodiment of the present disclosure, the process of forming the anode layer 21, the hole transport layer 22, the light-emitting layer 23, and the electron transport layer 24 in the step S1 may adopt the exiting process of preparing the above-mentioned layers in the prior art, which is not particularly limited herein.

In the step S2, the method of placing a material of the functional layer 25 on the electron transport layer 24 away from the light-emitting layer 23 to prepare the functional layer 25 includes coating, spin-coating, or inkjet-printing. Preferably, in the step S2, the material of the functional layer 25 is directly printed on a surface of the electron transport layer 24 by inkjet-printing.

Specifically, in the step S2, a step of preparing the material of the functional layer includes:

Step S201: immersing the conductive metal nanoparticles in an acidic solvent for 12-24 hours;

Step S202: filtering the immersed conductive metal nanoparticles, and followed by a drying treatment at a temperature of 80 to 120° C.;

Step S203: formulating the dried conductive metal nanoparticles into the acidic metal sol; and Step S204: mixing the acidic metal sol and an organic material according to a certain ratio to form the material of the functional layer.

Further, in the step S201, the conductive metal nanoparticles are Au conductive nanoparticles. Of course, in some embodiments, the conductive metal nanoparticles may also be Ag conductive nanoparticles or Al conductive nanoparticles, and alternatively, the conductive metal nanoparticles may also be two or more of conductive Au nanoparticles, conductive Ag nanoparticles, and conductive Al nanoparticles, which can also obtain the same technical effects as the embodiment of the present disclosure, and can be selected according to actual needs, which is not particularly limited herein.

Optionally, in the step S201, the acidic solvent used to immerse the conductive metal nanoparticles may include dilute nitric acid, acetic acid, dilute phosphoric acid, or dilute hydrochloric acid. Preferably, the acidic solution is dilute hydrochloric acid with a concentration of 5-25%. In some other embodiments, the acidic solution may also be dilute nitric acid, acetic acid, or dilute phosphoric acid, which is not particularly limited herein.

Preferably, in the step S202, a temperature for drying the conductive metal nanoparticles immersed in the acid solution should be 100° C.

Specifically, in the step S203, a solvent system of the conductive metal nanoparticles formulated as the acidic metal sol is a single solvent or a mixture of organic polymers, such as toluene, benzene and other systems.

Specifically, in an embodiment of the present disclosure, a ratio of the acidic metal sol to the organic material in the material of the functional layer 25 is 3:3, so as to ensure the flatness of a surface of a side of the functional layer 25 close to the cathode layer 26 as well as the adhesion to the adjacent layer, and meanwhile, the conductive metal nanoparticles can be evenly dispersed in the functional layer 25 to ensure the functionality of the acidic metal sol. Of course, the ratio of the acidic metal sol to the organic material is not particularly limited to the 3:3 provided in the embodiment of the present disclosure. In other embodiments, as long as the ratio of the acidic metal sol to the organic material ranges from 1:5 to 5:1, the same or similar technical effects as the above embodiments can be obtained, and the specific ratio can be selected according to actual needs, which is not particularly limited herein.

Beneficial effect of embodiments of the present disclosure: In an embodiment of the present disclosure, by additionally introducing a functional layer between the cathode layer and the light-emitting layer, wherein the material of the functional layer includes an acidic metal sol having hydrogen ions which can adhere to a surface of the conductive metal nanoparticles in the acidic metal sol, which can be anchored with cations on a surface of a side of the cathode layer close to the functional layer, adhesion between the functional layer and the cathode layer is thereby enhanced, and separation and peeling of the layers is prevented. In addition, direction of free electrons in the cathode layer will also be changed to avoid the coupling reaction with photons to generate surface plasmon waves, thereby improving the light-emitting efficiency of the organic light-emitting diode. Furthermore, the organic material can ensure the flatness of a surface of a side the functional layer close to the cathode layer, to prevent the conductive metal nanoparticles in the acidic metal sol after curing from forming an uneven nanostructure which reduces the bonding strength between the functional layer and the cathode layer, and to prevent the cathode layer and the functional layer from separation and peeling at an interface therebetween, and meanwhile, the electron transport layer and the light-emitting layer under the functional layer may be prevented from being damaged during the process of forming the cathode layer.

While the invention has been described by way of example and in terms of the preferred embodiments, it is to be understood that the present disclosure is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light-emitting diode device, comprising an anode layer, a hole transport layer, a light-emitting layer, an electron transport layer, a functional layer, and a cathode layer that are sequentially stacked, wherein material of the functional layer comprises an acidic metal sol, and the acidic metal sol contains conductive metal nanoparticles.

2. The organic light-emitting diode device according to claim 1, wherein the conductive metal nanoparticles comprise one or more of conductive Au nanoparticles, conductive Ag nanoparticles, and conductive Al nanoparticles.

3. The organic light-emitting diode device according to claim 1, wherein the organic light-emitting diode device further comprises a buffer layer comprising an organic material, and the buffer layer is disposed between the functional layer and the electron transport layer.

4. The organic light-emitting diode device according to claim 1, wherein material of the functional layer further comprises an organic material.

5. The organic light-emitting diode device according to claim 4, wherein a ratio of the acidic metal sol to the organic material of the functional layer is between 1:5 and 5:1.

6. The organic light-emitting diode device according to claim 4, wherein the organic material of the functional layer comprises epoxy resin.

7. The organic light-emitting diode device according to claim 1, wherein the organic light-emitting diode device further comprises a hole injection layer and an electron injection layer, the hole injection layer is disposed between the hole transport layer and the anode layer, and the electron injection layer is disposed between the functional layer and the electron transport layer.

8. A display device, comprising a device body and a display panel disposed on the device body, wherein the display panel comprises a thin film transistor array substrate and a plurality of organic light-emitting diode devices disposed on the thin film transistor array substrate, each of the organic light-emitting diode devices comprises an anode layer, a hole transport layer, a light-emitting layer, an electron transport layer, a functional layer, and a cathode layer that are sequentially stacked; and
wherein material of the functional layer comprises an acidic metal sol, and the acidic metal sol contains conductive metal nanoparticles.

9. The display device according to claim 8, wherein the conductive metal nanoparticles comprise one or more of conductive Au nanoparticles, conductive Ag nanoparticles, and conductive Al nanoparticles.

10. The display device according to claim 8, wherein the organic light-emitting diode device further comprises a buffer layer comprising an organic material, and the buffer layer is disposed between the functional layer and the electron transport layer.

11. The display device according to claim 8, wherein material of the functional layer further comprises an organic material.

12. The display device according to claim 11, wherein a ratio of the acidic metal sol to the organic material of the functional layer is between 1:5 and 5:1.

13. The display device according to claim 12, wherein the organic material of the functional layer comprises epoxy resin.

14. The display device according to claim 8, wherein the organic light-emitting diode device further comprises a hole injection layer and an electron injection layer, the hole injection layer is disposed between the hole transport layer and the anode layer, and the electron injection layer is disposed between the functional layer and the electron transport layer.

15. A method of manufacturing an organic light-emitting diode device, comprising:
providing a substrate on which an anode layer, a hole transport layer, a light-emitting layer, and an electron transport layer are sequentially formed;
forming a functional layer on a side of the electron transport layer away from the light-emitting layer, wherein material of the functional layer comprises an acidic metal sol comprising conductive metal nanoparticles; and
forming a cathode layer on a side of the functional layer away from the electron transport layer.

16. The method of manufacturing the organic light-emitting diode device according to claim 15, wherein a step of preparing the material of the functional layer comprises:
immersing the conductive metal nanoparticles in an acidic solvent for 12-24 hours;
filtering the immersed conductive metal nanoparticles, and followed by a drying treatment at a temperature of 80 to 120° C.;
formulating the dried conductive metal nanoparticles into the acidic metal sol; and
mixing the acidic metal sol and an organic material according to a certain ratio to form the material of the functional layer.

17. The method of manufacturing the organic light-emitting diode according to claim 16, wherein the conductive metal nanoparticles comprise one or more of conductive Au nanoparticles, conductive Ag nanoparticles, and conductive Al nanoparticles.

18. The method of manufacturing the organic light-emitting diode according to claim 16, wherein the acidic solvent comprises dilute nitric acid, acetic acid, dilute phosphoric acid, or dilute hydrochloric acid.

19. The method of manufacturing the organic light-emitting diode according to claim 16, wherein a concentration of the acidic solvent is between 5% and 25%.

20. The method of manufacturing the organic light-emitting diode according to claim 16, wherein a ratio of the acidic metal sol to the organic material is between 1:5 and 5:1.

* * * * *